(12) United States Patent
Rodriguez et al.

(10) Patent No.: US 10,152,257 B2
(45) Date of Patent: Dec. 11, 2018

(54) RANDOM NUMBER GENERATION IN FERROELECTRIC RANDOM ACCESS MEMORY (FRAM)

(71) Applicant: Texas Instruments Incorporated, Dallas, TX (US)

(72) Inventors: John A Rodriguez, Dallas, TX (US); Robert C Baumann, Dallas, TX (US); Richard A Bailey, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/852,618

(22) Filed: Dec. 22, 2017

(65) Prior Publication Data

US 2018/0188987 A1   Jul. 5, 2018

Related U.S. Application Data

(63) Continuation of application No. 15/467,222, filed on Mar. 23, 2017, now Pat. No. 9,851,914.

(60) Provisional application No. 62/313,034, filed on Mar. 24, 2016.

(51) Int. Cl.
  *G11C 11/22* (2006.01)
  *G06F 3/06* (2006.01)
  *G06F 7/58* (2006.01)

(52) U.S. Cl.
  CPC .......... *G06F 3/0623* (2013.01); *G06F 3/0638* (2013.01); *G06F 3/0679* (2013.01); *G06F 7/588* (2013.01); *G11C 11/221* (2013.01); *G11C 11/2273* (2013.01); *G11C 11/2275* (2013.01)

(58) Field of Classification Search
  CPC ....................................................... G11C 11/22
  USPC ....... 365/49.13, 65, 109, 117, 145, 148, 158
  See application file for complete search history.

(56) References Cited

U.S. PATENT DOCUMENTS

| | | | |
|---|---|---|---|
| 9,401,196 B1 | 7/2016 | Juvekar et al. | |
| 2002/0196656 A1* | 12/2002 | Ogiwara | G11C 11/22 365/145 |
| 2003/0235066 A1* | 12/2003 | Forbes | G11C 11/22 365/145 |
| 2008/0175034 A1* | 7/2008 | Hagiwara | G11C 11/22 365/145 |
| 2015/0355886 A1 | 12/2015 | Peeters et al. | |

* cited by examiner

*Primary Examiner* — Harry W Byrne
(74) *Attorney, Agent, or Firm* — Kenneth Liu; Charles A. Brill; Frank D. Cimino

(57) ABSTRACT

Disclosed embodiments relate to generating random numbers using two transistor, two capacitor (2T-2C) ferroelectric memory cells. In accordance with one disclosed embodiment, an n-bit random number can be generated by writing to a uniform data pattern to a set of n 2T-2C ferroelectric memory cells in a 1T-1C mode so that all ferroelectric capacitors of the n 2T-2C cells have a polarization state corresponding to the same data value (e.g., all 0's or all 1's). The n 2T-2C cells are then read in a 2T-2C mode, so that a random bit (a 0 or 1) is produced for each cell, resulting in an n-bit random number. The n-bit random number is stored in the n 2T-2C ferroelectric memory cells by a rewrite operation. Such random numbers are useful for many purposes, including security, such as authentication, integrity checking, and encryption, and for identification.

19 Claims, 4 Drawing Sheets

RANDOM NUMBER GENERATION IN FERROELECTRIC RANDOM ACCESS MEMORY (FRAM)

CROSS REFERENCE TO RELATED APPLICATION

This application is a continuation of and claims the benefit of U.S. patent application Ser. No. 15/467,222 filed on Mar. 23, 2017, which claims the benefit of U.S. Provisional Application Ser. No. 62/313,034, filed Mar. 24, 2016 and entitled "GENERATION OF A RANDOM NUMBER USING FERROELECTRIC MEMORY," the disclosures of which are incorporated by reference herein in their entireties.

BACKGROUND

This section is intended to introduce the reader to various aspects of art that may be related to various aspects of the subject matter described and/or claimed below, and is believed to be helpful in providing background information to facilitate a better understanding of the present disclosure. It should be understood that these statements are to be read in this light, not as admissions of prior art.

The present disclosure relates generally to ferroelectric non-volatile memory cells and their use in the context of an electronic device and, more specifically, to generation of random numbers using ferroelectric non-volatile memory cells.

Electronic devices, such as consumer electronics, integrated circuits, embedded systems, microcontrollers, and the like, can often include one or more memory devices that store information, such as data and program instructions. To prevent unauthorized access to such information, such devices may include one or more security measures to protect information. This is particularly useful in cases where the protected information is of a sensitive nature, such as, for example, a patient's medical information stored on a medical device, a user's payment information stored on a "smart" credit card, or even a user's personal information (e.g., internet browsing history, GPS location, text messages) stored on a smartphone. Moreover, there has been a growing trend in recent years to incorporate network connectivity into electronic devices. For instance, some electronic devices that traditionally lacked such network connectivity, such as home appliances, televisions, and even automobiles, are now being manufactured with network connectivity functions. It is envisioned that this trend, sometimes called the "internet of things" (IoT), will continue and that network connectivity will continue to be incorporated into more and more electronic devices. However, network connectivity also presents an additional vector by which an unauthorized user may attempt to access protected information. Accordingly, the need for security measures in electronic devices for protection of information is now more important than ever.

Examples of types of security measures that can be implemented on such electronic devices include authentication measures, integrity monitoring, and encryption. Authentication generally requires that proper credentials, such as a password or key phrase, be supplied in order to access protected information. Integrity checking can be used to monitor for changes in software files to ensure that program software, such as an operating system or application software, has not been modified in an unauthorized manner. Encryption can be used to encode protected information on the device so that only authorized parties have access, usually through the use of one or more digital encryption keys. For example, such digital encryption keys may be based on a symmetric-key algorithm (e.g., Advanced Encryption Standard (AES) 128, 192, or 256 bits) or an asymmetric key algorithm (e.g., using a public/private key pair).

Random number generation is often used to implement the aforementioned security measures. For instance, random numbers can be used to generate passwords for authentication purposes and are often the basis of many encryption schemes. By way of example, random numbers can be used as a basis for generating digital keys, such as for data encryption or file integrity checking (e.g., generating a checksum value). Many current techniques for generating random numbers typically involve software routines and algorithms that generate a pseudo-random number based on an initial seed value. Numbers generated by such a process are pseudo-random because while they might satisfy one or more statistical tests for randomness, they are still determined in part by the initial seed value. It is generally desirable that a random number be as unpredictable as possible. Stated another way, if random numbers used for security purposes can be guessed with any accuracy, the security of any scheme relying on such random numbers is compromised. Accordingly, improved methods of generating random numbers are particularly useful, especially as the need for protecting digital information continues to grow.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Aspects of the present disclosure relate to the generation of random numbers using 2T-2C ferroelectric memory cells. To generate, for example, an n-bit random number, a set of n 2T-2C ferroelectric memory cells are written to in a 1T-1C mode so that all the capacitors in the set of n 2T-2C cells have a polarization state corresponding to the same data value (e.g., all logical 0's or all logical 1's). Each of then 2T-2C cells is then read in a 2T-2C mode, so that a random bit (0 or 1) is produced for each cell, thus producing an n-bit random number. This generated n-bit random number is then stored in the n 2T-2C cells as part of a rewrite process, which is typical of ferroelectric memories due to the destructive nature of their read operations. Such random numbers are useful for many purposes, including security, such as authentication, integrity checking, and encryption, and for identification.

Random numbers generated using 2T-2C ferroelectric memory cells, as described herein, may offer an improved degree of randomness compared to some software-based random number generator algorithms that rely on an initial seed value.

Various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments of the present disclosure are described below. These embodiments are only examples of the presently disclosed techniques. In an effort to provide a concise description of these embodiments, all features of an actual implementation may not be described in the specification. It should be appreciated that in the development of any such implementation, as in any engineering or design project, numerous implementation-specific decisions are made to achieve the developers' specific goals, such as compliance with system-related and/or business-related constraints, which may vary from one implementation to another. Moreover, it should be appreciated that such development efforts might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than those listed. The embodiments discussed below are intended to be illustrative examples and should not be construed to mean that they are necessarily preferential in nature. Additionally, it should be understood that references to "one embodiment" or "an embodiment" within the present disclosure are not to be interpreted as excluding the existence of additional embodiments that also incorporate the recited features.

The present disclosure relates to techniques for using ferroelectric random access memory (FRAM) to generate random numbers. As is known in the art, FRAM is a type of non-volatile storage in which the construction of its memory cells are based on capacitors in which the dielectric material is a polarizable ferroelectric material, such as lead zirconate titanate (PZT) or strontium-bismuth-tantalate (SBT), rather than silicon dioxide or silicon nitride as typically used in non-ferroelectric capacitors. Hysteresis in the charge-vs.-voltage (Q-V) characteristic, based on the polarization state of the ferroelectric material, enables the non-volatile storage of binary states in these capacitors. In contrast, conventional MOS capacitors lose their stored charge on power-down of the device. It has been observed that ferroelectric capacitors can be constructed by processes that are largely compatible with modern CMOS integrated circuits, for example by placing the capacitors above the transistor level, between overlying levels of metal conductors.

Figure 1:
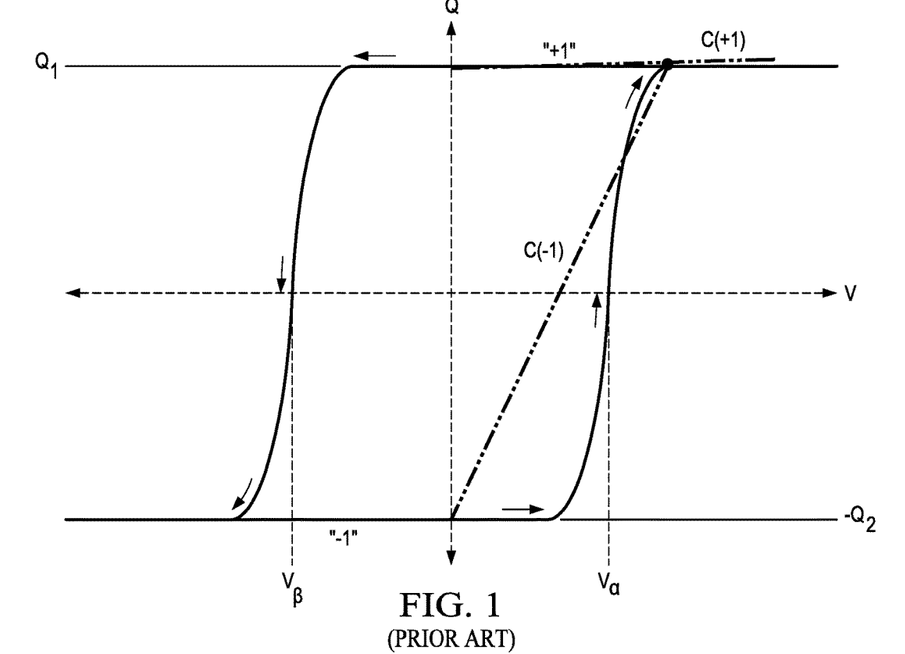
FIG. 1 is a plot of a charge-vs.-voltage characteristic of a conventional ferroelectric capacitor.

FIG. 1 is an example of a Q-V characteristic of a ferroelectric capacitor. Here, the charge (Q) stored across the conductive plates depends on the voltage applied to the plates (V), and also on the recent history of that voltage. If the voltage V applied across the capacitor plates exceeds a "coercive" voltage $+V_\alpha$, the capacitor polarizes into the "+1" state. According to this characteristic, once polarized to the "+1" state, so long as voltage V remains above coercive voltage $-V_\beta$, the capacitor exhibits a stored charge of $+Q_1$. Conversely, if the voltage V applied across the capacitor plates is more negative than coercive voltage $-V_\beta$, the capacitor is polarized into the "−1" state, and will exhibit a stored charge of $-Q_2$ for applied voltage V below $+V_\alpha$.

An important characteristic of ferroelectric capacitors, for purposes of non-volatile storage, is the difference in capacitance exhibited by a ferroelectric capacitor between its polarized states. As fundamental in the art, the capacitance of an element refers to the ratio of stored charge to applied voltage. While a ferroelectric capacitor has a linear capacitance by virtue of its construction as parallel plates separated by a dielectric film (i.e., the ferroelectric material), it also exhibits significant polarization capacitance (i.e., charge storage) in response to changes in polarization state that occurs upon application of a polarizing voltage. For example, referring to FIG. 1, the polarization of a ferroelectric capacitor from its "−1" state to its "+1" state is reflected in a relatively high capacitance C(−1), reflecting the storage of polarization charge in the capacitor in response to the change of polarization state by the voltage exceeding coercive voltage $V_\alpha$. On the other hand, a capacitor that already in its "+1" state exhibits little capacitance C(+1) due to polarization, since its ferroelectric domains are already aligned in the direction of the applied coercive voltage, causing little additional polarization charge to be stored. A stored logic state is read by interrogating the capacitance of the ferroelectric capacitors to discern its polarization state.

FRAM memory technology is now commonly used to realize non-volatile solid-state read/write random access memories in many electronic devices, particularly in portable electronic devices and systems for a number of different applications. For example, FRAM memory is considered an attractive component for implantable medical devices, such as pacemakers, defibrillators, and monitoring devices, due to the low power consumption of FRAM memory.

Figure 2A:
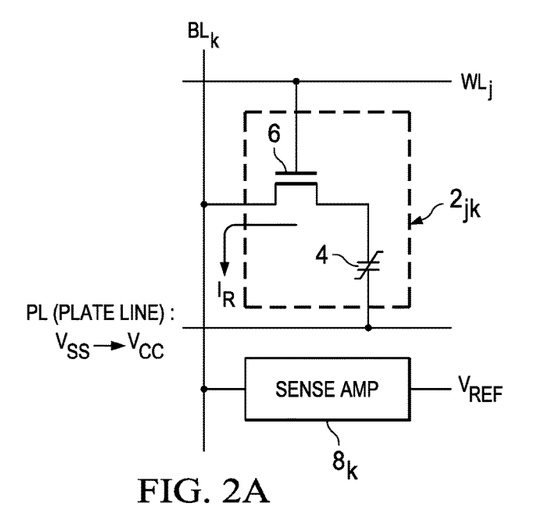
FIG. 2A is an electrical diagram, in schematic and block form, of a conventional one transistor, one capacitor (1T-1C) ferroelectric memory cell.

Different types of FRAM memory cell architectures are known, such as one-transistor, one-capacitor (1T-1C) and two-transistor, two-capacitor (2T-2C) architectures. 1T-1C cells are similar to conventional dynamic RAM memory cells and are attractive because of their smaller chip area relative to 2T-2C cells. FIG. 2A illustrates a typical arrangement of a conventional 1T-1C FRAM cell $2_{jk}$, which represents a single cell residing in a row j and a column k of an array of similar cells 2. Cell $2_{jk}$ includes ferroelectric capacitor 4 and MOS (metal-oxide semiconductor) n-channel pass transistor 6. The source-drain path of transistor 6 is connected between bit line $BL_k$ for column k of the array, and the top plate of ferroelectric capacitor 4; the gate of transistor 6 is controlled by word line $WL_j$ for row j of the array. The bottom plate of ferroelectric capacitor 4 is connected to plate line PL for the row, or which may be in common for all cells 2 in the array or array portion, depending on the architecture. As such, 1T-1C FRAM cells are similar in construction to conventional dynamic RAM memory cells. Sense amplifier $\mathbf{8}_k$ is coupled to bit line $BL_k$, and operates to compare the bit line voltage developed by read current $i_R$ to a reference voltage $V_{REF}$ generated by a reference voltage generator, or at a "dummy" bit line as may be produced by a reference capacitor, as is known in the art. This reference voltage $V_{REF}$ is typically at an intermediate level between the expected voltages for the "0" and "1" data states.

Figure 2B:
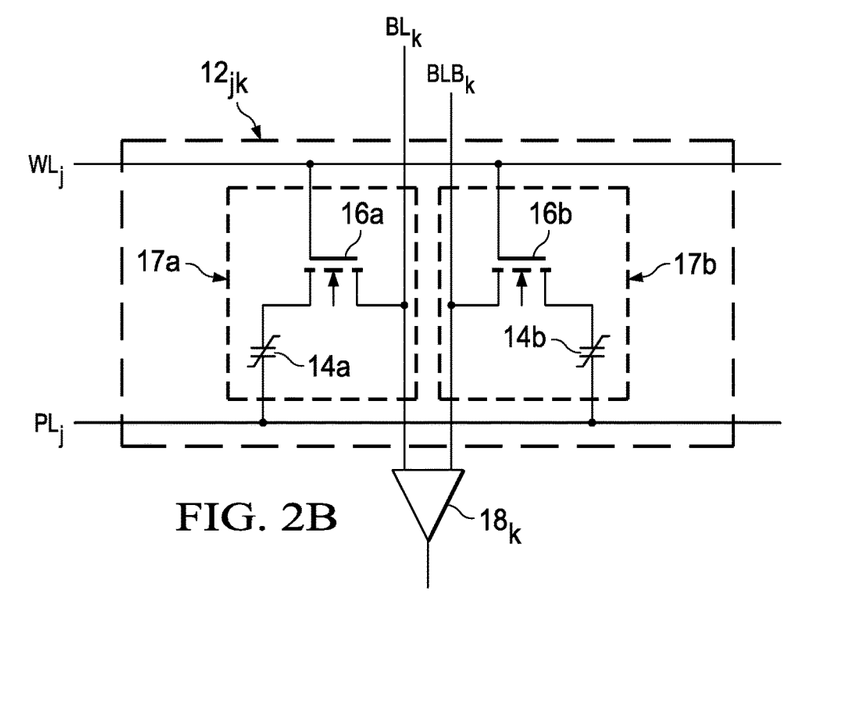
FIG. 2B is an electrical diagram, in schematic and block form, of a conventional two transistor, two capacitor (2T-2C) ferroelectric memory cell.

A 2T-2C memory cell includes two ferroelectric capacitors that are polarized to complementary states. FIG. 2B schematically illustrates memory cell $\mathbf{12}_{j,k}$ of conventional 2T-2C construction. In this example, cell $\mathbf{12}_{j,k}$ resides in a row j and a column k of a memory array, and includes two ferroelectric capacitors 14a, 14b and two MOS transistors 16a, 16b. Ferroelectric capacitors 14a, 14b are parallel-plate capacitors with ferroelectric material, such as PZT, as the dielectric; one or both of the plates may be formed in a metal or conductive metal compound material (e.g., a silicide, or conductive nitride). For example, the ferroelectric material may be formed over a bottom electrode and covered, for example, by a conductive multi-layer top electrode. One plate of each of ferroelectric capacitors 14a, 14b is connected to plate line $PL_j$ for row j. The other plate of ferroelectric capacitor 14a is connected to bit line $BL_k$ (the "true" bit line) for column k via the source-drain path of n-channel transistor 16a. Similarly, the second plate of ferroelectric capacitor 14b is connected to bit line $BLB_k$ (the "complement" bit line) via the source-drain path of n-channel transistor 16b. The gates of transistors 16a, 16b are driven by word line $WL_j$ for row j of the memory array.

In operation, ferroelectric capacitors 14a, 14b store complementary polarization states that are reflected as a differential voltage or current between bit lines $BL_k$, $BLB_k$ when read. As such, a 2T-2C write operation to memory cell $\mathbf{2}_{j,k}$ consists of applying complementary levels to bit lines $BL_k$, $BLB_k$ at a polarity corresponding to the desired data state, while word line $WL_j$ is driven active high to turn on transistors 16a, 16b; a pulse at plate line $PL_j$ during this state causes opposite polarization voltages to polarize capacitors 14a, 14b into the corresponding complementary polarization states. In a read operation, bit lines $BL_k$, $BLB_k$ are precharged to a selected voltage and then float, after which word line $WL_j$ is asserted active high. A pulse at plate line $PL_j$ causes the complementary polarization states of capacitors 14a, 14b to be reflected as a differential signal across bit lines $BL_k$, $BLB_k$, respectively, for sensing and amplification by sense amplifier $\mathbf{18}_k$ for column k.

In comparing the 1T-1C and 2T-2C FRAM memory cell architectures, the 1T-1C cell has the advantage of increased bit density but the disadvantage of reduced read margin because of its single-ended sense relative to a reference voltage, while the 2T-2C cell provides the advantage of robust data retention from complementary data storage and differential sensing, but at only about one-half the bit density. As can be seen, the 2T-2C cell $\mathbf{12}_{jk}$ of FIG. 2B is essentially the components of two 1T-1C cells coupled to a common sense amplifier $\mathbf{18}_k$, but due to the nature of the 2T-2C architecture, when the cell $\mathbf{12}_{jk}$ is read from or written to in the manner described above, referred to as 2T-2C mode, the cell $\mathbf{12}_{jk}$ represents one data bit. Stated another way, reading the contents of cell 12 in 2T-2C mode returns one bit of data while writing to cell 12 in 2T-2C mode stores one bit of data.

As is well known in the art, regardless of the cell architecture used to implement a ferroelectric memory cell, ferroelectric memory cells have the characteristic of a destructive read. That is, the act of reading the ferroelectric memory cell results in the stored data being lost. Thus, a read operation on a ferroelectric memory cell includes a rewrite performed immediately thereafter to restore to the cell the information that was read from it, typically during the same cycle as the read operation.

As discussed above, the present disclosure provides techniques for generating a random number using 2T-2C ferroelectric memory cells. An example embodiment of such a technique is described by FIG. 3, which is a flow diagram depicting a process 30. Process 30 begins at step 32 at which a 1T-1C write of a uniform data pattern is performed on a set of 2T-2C ferroelectric memory cells. A uniform data pattern is a data pattern that has all the same logical values, for example, all logical 1 or all logical 0.

Figure 4A:
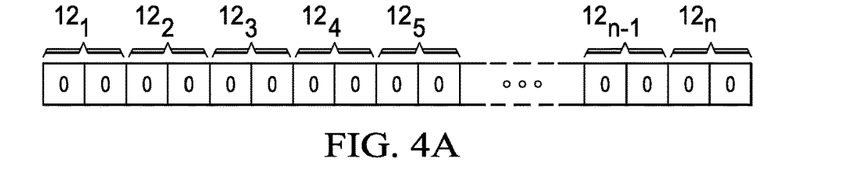
FIGS. 4A to 4C depict the method described in FIG. 3 being performed on a set of 2T-2C ferroelectric memory cells in accordance with one embodiment.

Referring to FIG. 2B, when writing to a 2T-2C cell 12 using a 1T-1C write mode, instead of capacitors 14a, 14b being polarized into complementary states, they are polarized into the same state. For the purposes of this description, each transistor and capacitor pair (14a, 16a and 14b, 16b) of a 2T-2C ferroelectric memory cell may be referred to as a "sub-cell," for example sub-cells 17a, 17b. Thus, each "sub-cell" of the 2T-2C memory cell 12 stores the same logical value. Stated another way, writing to a 2T-2C ferroelectric memory cell in a 1T-1C mode can be viewed as treating each of the sub-cells of the 2T-2C cell as a separate 1T-1C cell. FIG. 4A depicts the result of performing a 1T-1C write of a uniform data pattern of logical 0's to n 2T-2C cells $\mathbf{12}_1$-$\mathbf{12}_n$. Here, the capacitors of each sub-cell of each of the 2T-2C cells $\mathbf{12}_1$-$\mathbf{12}_n$ are all polarized to a polarization state corresponding to a logical 0. Of course, a uniform data pattern of logical 1's could also be used. As used herein, a uniform data pattern is understood to mean that for a given set of 2T-2C ferroelectric memory cells on which the 1T-1C write is being performed, the sub-cells of every one of the set of 2T-2C cells are written to store the same logical value. Stated another way, the result of writing a uniform data pattern to a set of 2T-2C ferroelectric memory cells in a 1T-1C mode is that the sub-cells within each 2T-2C cell store the same logical value and that all sub-cells of the set of 2T-2C ferroelectric memory cells store that same logical value.

Figure 3:
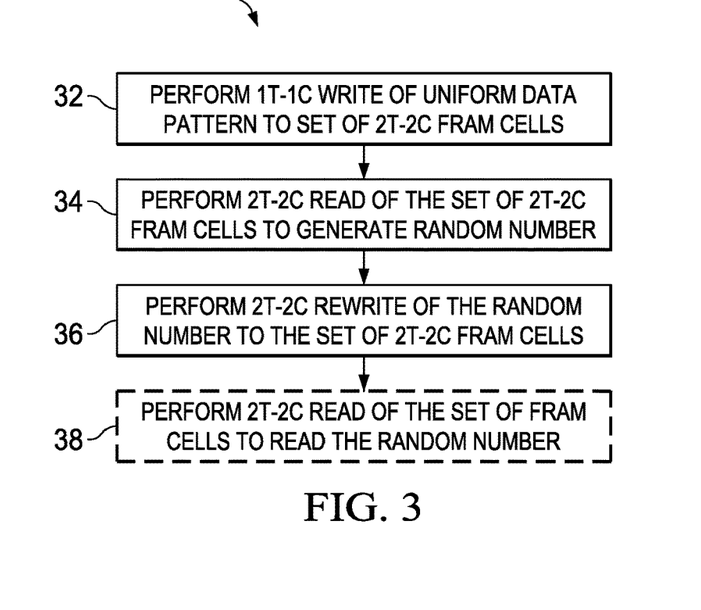
FIG. 3 is a flow chart depicting a method for generating a random number using 2T-2C ferroelectric memory cells in accordance with one embodiment.

Following the 1T-1C write of the uniform data pattern at step 32, process 30 continues to step 34 at which the set of 2T-2C cells are read in a 2T-2C mode. As discussed above with reference to FIG. 2B, in a normal 2T-2C read operation, the complementary polarization states of capacitors 14a, 14b are reflected as a differential signal across bit lines $BL_k$, $BLB_k$, respectively, and that differential signal is sensed and amplified by sense amplifier $\mathbf{18}_k$ for column k to determine the data state stored by the 2T-2C cell. However, because the sub-cells of each 2T-2C cell $\mathbf{12}_1$-$\mathbf{12}_n$ store the same logical value due to the 1T-1C writing of the uniform data pattern, a differential signal does not develop, as the lack of complementary states being stored in the capacitors 14a, 14b of the 2T-2C cell will not produce complementary signals on bit lines $BL_k$, $BLB_k$. This results in sense amplifier $\mathbf{18}_k$ producing a random output value that is either a logical 0 or a logical 1. Stated another way, the random output value is generated as a result of providing non-complementary input signals (by bit lines $BL_k$, $BLB_k$) to a differential sense amplifier that expects complementary input signals in order to determine a voltage differential.

Those having ordinary skill in the art will appreciate that in an ideal sense amplifier, the distribution of logical 0's and logical 1's under these circumstances will be approximately 50 percent (e.g., a 0 value is expected half the time and 1 value is expected the other half of the time). In real world practice, however, the sense amplifier may have some amount of offset resulting, for example, from transistor mismatch due to process variations (e.g., dopant number fluctuations, interface-state density fluctuations, etc.) that can cause this distribution to deviate somewhat from 50 percent. Nonetheless, even under real world conditions, it has been found that performing (step 34) a 2T-2C read operation on a 2T-2C ferroelectric memory cell having sub-cells storing the same logic state (as a result of a 1T-1C write of a uniform data pattern) still results in the sense amplifier producing a logical 0 or a logical 1 with a distribution that does not deviate significantly from 50 percent. For example, in testing, it has been observed that the distributions of logical 1's and logical 0's (or vice versa) in real world operation using the present techniques may be approximately 52-48 percent or 53-47 percent, which still provides a sufficiently high degree of randomness. In some embodiment, the randomness may be enhanced by depolarizing the ferroelectric memory cells through exposure to high temperatures. Such exposure may be performed at certain steps during manufacturing, such as during mold curing, wire bonding, or board assembly steps, in which the ferroelectric memory cells may be exposed to temperatures ranging anywhere from 180 to 260 degrees ° C. or higher.

Figure 4B:
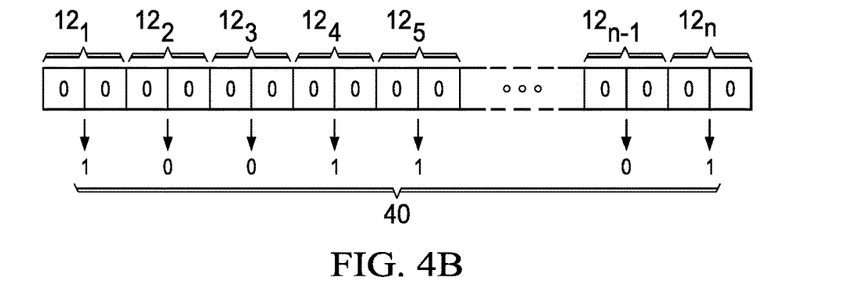

FIG. 4B depicts that the result of performing a 2T-2C read on the 2T-2C cells $12_1$-$12_n$ produces, for each cell $12_1$-$12_n$, a logical 0 or a logical 1 in a random manner. For example, the reading of 2T-2C cell $12_1$ produces a logical 1, the reading of 2T-2C cell $12_2$ produces a logical 0, the reading of 2T-2C cell $12_3$ produces a logical 0, the reading of 2T-2C cell $12_4$ produces a logical 1, the reading of 2T-2C cell $12_5$ produces a logical 1, the reading of 2T-2C cell $12_{n-1}$ produces a logical 0, and the reading of 2T-2C cell $12_n$ produces a logical 1.

Figure 4C:
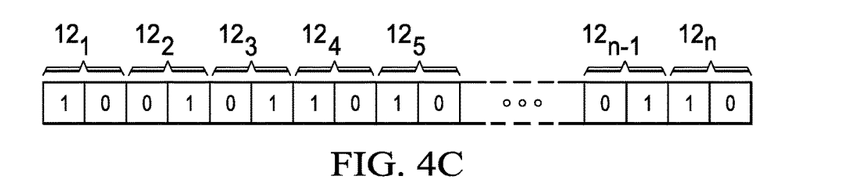

Thus, the result of the 2T-2C read of ferroelectric memory cells $12_1$-$12_n$ produces a binary random number value 40 that is n bits long. As will be appreciated, n can be any suitable number, such as 128 for a 128-bit value, 192 for a 192-bit value, or 256 for a 256-bit value (e.g., lengths commonly used in AES encryption). As stated above, since the reading of a ferroelectric memory cell is destructive, the data read from the cell is written back to the cell as part of the read operation (e.g., in the same memory cycle as the read operation). Accordingly, at step 36 of process 30, the random number 40 generated at step 34 is rewritten into the 2T-2C cells using a 2T-2C write operation (as opposed to the 1T-1C write operation used at step 32). This is illustrated by FIG. 4C, which depicts the rewriting of the n bit random number 40 into the 2T-2C cells $12_1$-$12_n$ using a 2T-2C write operation. Assuming, by way of example, that 2T-2C cell $12_1$ corresponds to cell $12_{jk}$ of FIG. 2B, complementary levels are applied to bit lines $BL_k$, $BLB_k$ at a polarity corresponding to the desired data state, while word line $WL_j$ is driven active high to turn on transistors 16a, 16b. Since the data state read from 2T-2C cell $12_1$ is a logical 1, the data state to be rewritten is a logical 1. A pulse at plate line $PL_j$ during this state causes opposite polarization voltages to polarize capacitors 14a, 14b into the corresponding complementary polarization states in which a logical 1 is stored in capacitor 14a and the complement, a logical 0, is stored in capacitor 14b.

Using cell $12_{jk}$ of FIG. 2B as a reference for all the other 2T-2C cells $12_2$-$12_n$, then, in a similar manner, rewriting of the logical 0 read from 2T-2C cell $12_2$ results in storing a logical 0 polarization state in capacitor 14a and a logical 1 polarization state in capacitor 14b, rewriting of the logical 0 from 2T-2C cell $12_3$ results in storing a logical 0 polarization state in capacitor 14a and a logical 1 polarization state in capacitor 14b, rewriting of the logical 1 read from 2T-2C cell $12_4$ results in storing a logical 1 polarization state in capacitor 14a and a logical 0 polarization state in capacitor 14b, rewriting of the logical 1 read from 2T-2C cell $12_5$ results in storing a logical 1 polarization state in capacitor 14a and a logical 0 polarization state in capacitor 14b, rewriting of the logical 0 read from 2T-2C cell $12_{n-1}$ results in storing a logical 0 polarization state in capacitor 14a and a logical 1 polarization state in capacitor 14b, and rewriting of the logical 1 read from 2T-2C cell $12_{n-1}$ results in storing a logical 1 polarization state in capacitor 14a and a logical 0 polarization state in capacitor 14b.

Referring again to FIG. 3, at the completion of step 36, the generated random number 40 is stored in the same 2T-2C ferroelectric memory cells used to generate it at step 34. Since FRAM is a non-volatile storage, this random number is stored persistently and remains available until overwritten or erased. While steps 32 through 36 describe the generation of a random number, it is understood that once generated, the random number stored in the set of 2T-2C memory cells (e.g., cells $12_1$-$12_n$) can be accessed by performing a 2T-2C read on that set of 2T-2C memory cells. For instance, a 2T-2C read performed on memory cells $12_1$-$12_n$ (shown as additional step 38 in FIG. 3) after the steps 32 to 36 have been performed will produce random number 40.

Those skilled in the art will appreciate that process 30 can be carried out at various stages during manufacture of the ferroelectric memory cells. As one example, process 30 can be performed by the manufacturer during wafer probe testing on a ferroelectric memory die containing an array of 2T-2C cells while the die is still part of an uncut wafer. Thus, a random number may be generated and stored in the FRAM array on the die prior to singulation and packaging.

In another example, the 1T-1C write (step 32) of process 30 can be performed by the manufacturer during wafer probe testing, with the 2T-2C read (step 34) and rewrite (step 36) being performed after packaging the ferroelectric memory die. In a further example, the 1T-1C write (step 32) of process 30 is performed by the manufacturer after packaging the ferroelectric memory die, but the 2T-2C read (step 34) and rewrite (step 36) is performed by a customer who purchases the packaged ferroelectric memory device from the manufacturer. In yet another example, the manufacturer does not perform any steps of process 30 and, instead, process 30 is performed by the customer. For example, issuing a specific command to the FRAM device or entering a test mode can allow access to functionality provided by process 30 to generate a random number.

Further, while the above embodiment describes the use of a uniform data pattern in performing the 1T-1C write (step 32), in another embodiment, the data pattern written in 1T-1C mode can be a non-uniform data pattern. As used herein, a non-uniform data pattern is understood to mean that for a given set of 2T-2C ferroelectric memory cells on which the 1T-1C write is being performed, the two sub-cells for a first 2T-2C cell of the set will store the same logical value, and the two sub-cells of a second 2T-2C cell of the set (e.g., an adjacent cell) will store the same logical value but not necessarily the same logical value as the sub-cells of the first 2T-2C cell. Stated another way, the result of writing a non-uniform data pattern to a set of 2T-2C ferroelectric memory cells in a 1T-1C mode is that sub-cells of different 2T-2C cells in the set can store different logical values so long as the sub-cells of the same 2T-2C cell store the same logical value, thus allowing each 2T-2C cell to produce a random bit value that is either a logical 0 or logical 1 when read in the 2T-2C mode (step 34 of FIG. 3).

As an example, a non-uniform data pattern can be a pattern of logical 1's and logical 0's that alternates for each 2T-2C cell. For instance, the two sub-cells of a first 2T-2C cell are each written to a value of logical 1, the two sub-cells of a second 2T-2C cell directly adjacent (e.g., on the same word line) to the first 2T-2C cell are each written to a value of logical 0, the two sub-cells of a third 2T-2C cell directly adjacent to the second 2T-2C cell are each written to a value of logical 1, and so forth. As another example, the non-uniform data pattern is not necessarily an alternating pattern, but includes any data pattern where some of the 2T-2C cells of the set have both of their sub-cells written to a logical 1 value while the remainder of the 2T-2C cells of the set have both of their sub-cells written to a logical 0 value. In some embodiments, the non-uniform data pattern may be selected based on hysteretic characteristics of the 2T-2C cells and/or the random number generated may be at least partially dependent on such hysteretic characteristics (e.g., for non-symmetrical hysteresis, a 2T-2C cell may exhibit a tendency to program more easily toward one of the logical values 0 or 1 than the other).

Accordingly, the embodiments described herein provide a robust technique for generating random numbers that do not require the use of pseudo-random number generator software-based algorithms that use an initial seed value. By basing the generation of each bit of the random number 40 on a random behavior of a differential sense amplifier (i.e., generating an output without complementary input signals), the generation of random numbers using such methods may, in some cases, provide a better degree of randomness compared to some known pseudo-random algorithms. As stated above, random numbers generated using the disclosed techniques are useful as security measures for protecting information that may be stored in an FRAM memory, such as for purposes of authentication (e.g., passwords), file integrity checking (e.g., checksum values), and data encryption (e.g., encryption keys). Such random numbers can also be used for other purposes, such as generating a unique identification or serial number for the FRAM memory or a device containing the FRAM memory.

Figure 5:
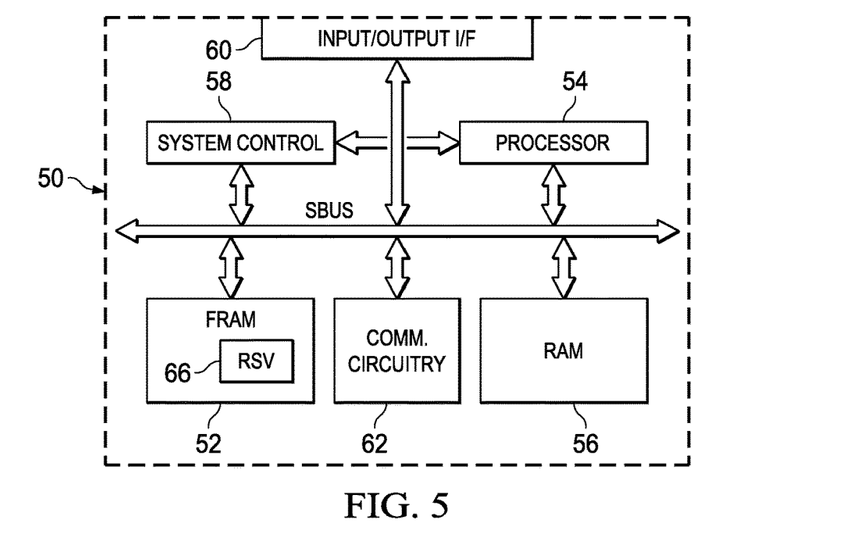
FIG. 5 is a functional block diagram of an electronic device that includes a ferroelectric memory device in accordance with one embodiment.

An FRAM device that implements the random number generation techniques described above may be a stand-alone memory device, or may be part (e.g., a component) of an electronic device. Referring now to FIG. 5, a functional block diagram of an electronic device 50 that includes FRAM 52 implementing such random number generation techniques is illustrated in accordance with an embodiment. Electronic device 50 includes a processor 54, which is connected to a system bus SBUS. FRAM 52, as well as random access memory (RAM) 56, reside on system bus SBUS as memory resources accessible to processor 54.

As stated above, FRAM 52 provides non-volatile storage and can be used for persistent storage of data, whereas RAM 56, such as dynamic random access memory (DRAM), is typically volatile and loses its data state once power is removed. FRAM 52 may serve as program memory storing program instructions executable by the processor 54. Both RAM 56 and FRAM 52 may serve as data memory. In some cases, program instructions may reside in RAM 56 for recall and execution by processor 54. Other system functions are shown, in device 50 by way of system control logic 58 and input/output interface 60.

Processor 54 controls the general operation of electronic device 50. For instance, processor 54 may provide the processing capability to execute an operating system, programs, user and application interfaces, and any other functions of device 50. Processor 54 may include a general-purpose or application-specific (ASIC) processor, field-programmable gate array (FPGA), graphics processor (GPU), digital signal processor, a system-on-chip (SoC), microcontroller, and/or related chip sets. Device 50 further includes communication circuitry 62 enabling device 50 to connect to a network, such as a local area network, a wireless network (e.g., an 802.11x network or Bluetooth network), or a cellular data network (e.g., GPRS, EDGE, 3G, 4G, LTE, WiMax, etc.), and to communicate with other devices over the network.

The illustrative electronic device 50 of FIG. 5 may be any type of device that incorporates memory and/or non-volatile memory. For example, device 50 may be a microcontroller unit or embedded processing unit. In one such embodiment, device 50 may be a microcontroller unit (MCU) capable of operating over a wide temperature range with generally low power consumption, and which includes a low power processor, a volatile memory, such as SRAM, non-volatile memory, as well as analog and mixed signal and power management circuitries. Such a device may be suitable for a number of applications in various industries, for example, industrial, medical device, and automotive applications. By way of example only, device 50 may be a model of an embedded processor, a microcontroller unit, a SoC, or a digital signal processor available from Texas Instruments Incorporated of Dallas, Tex. In one embodiment, the device 50 may also be a stand-alone ferroelectric memory device based on FRAM 52, in which case processor 54 and other functions shown in FIG. 5 are not necessarily included.

Further, device 50 may include additional or alternative functions to those shown in FIG. 5, or may have its functions arranged according to a different architecture from that shown. For instance, in other embodiments, device 50 may be a computing device, such as a mobile telephone (including smartphones), digital media player, a desktop, tablet, or notebook computer, a wearable computing device, and so forth. In such embodiments, device 50 may include additional functional blocks not shown in FIG. 1, such as input structures, various sensors, and a display. The various functions of device 50 may be realized and implemented using hardware elements (e.g., circuitry), software elements (e.g., computer instructions stored on a tangible computer-readable medium) or a combination of both hardware and software elements. Thus, the architecture and functionality of device 50 shown in FIG. 1 are provided by way of example, and are not intended to limit the scope of this disclosure.

In the embodiment shown in FIG. 5, FRAM 52 may include an array of 2T-2C ferroelectric memory cells, for example, of the type described above in FIG. 2B. A portion of the FRAM array, shown in FIG. 5 as reserved area 66, may be used for generating random numbers using the above-described methods. Reserved area 66 may be configured as a dedicated area of the array for generating and storing random numbers. Thus, applications executing on device 50 may be unable to access reserved area 66 of the FRAM array unless a given application has permission to access and/or generate a random number (e.g., encryption software for generating a digital key). As will be appreciated, restricting access to reserved area 66 can be accomplished using in any suitable manner, for example, restricting access to memory addresses corresponding to cells in reserved area 66. Depending on the size of reserved area 66 (e.g., the number of available cells), multiple random numbers or various lengths may be generated and stored. As will be appreciated, FRAM 52 may include a controller or, in some cases, processor 54 may act as a controller, to control the various functions of FRAM 52.

Figure 6:
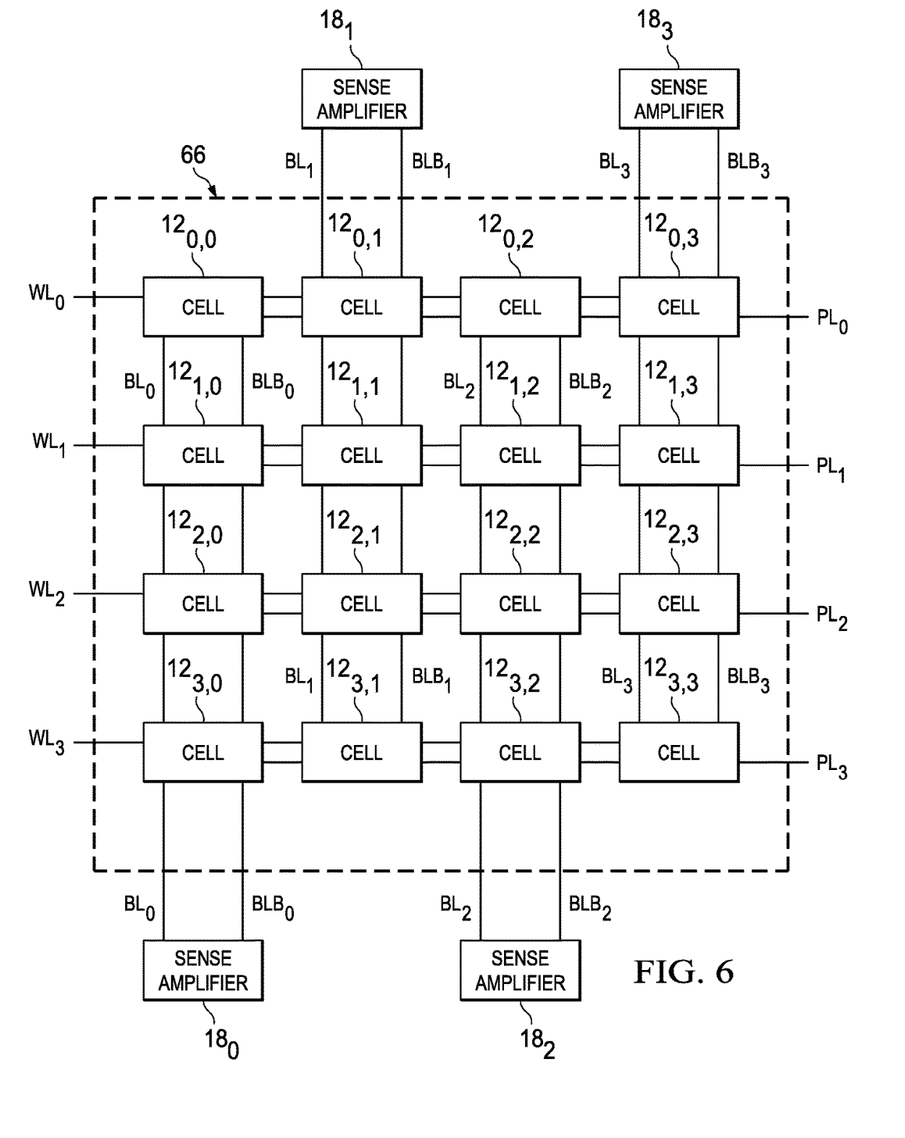
FIG. 6 is an electrical diagram, in block form, of a portion of a ferroelectric memory cell array reserved for generating and storing random numbers.

FIG. 6 is a simplified schematic representation a group of 2T-2C ferroelectric memory cells defining reserved area 66 within an FRAM array of FRAM 52. For sake of simplicity, sixteen memory cells $12_{0,0}$ to $12_{3,3}$ arranged in four rows and columns, each having four cells, are shown, although in practice reserved area 66 may include many more such cells. For instance, as described above, random number 40 (FIG. 4B) can be an n-bit value of any desired length, such as 128, 192, 256 bits or more. For consistency, reference numbers used in FIG. 2B are used to refer to like elements in FIG. 6.

Referring to the example of generating and storing a random number 40 in FIGS. 4A to 4C, the 2T-2C ferroelectric memory cells $12_1$-$12_n$ may represent a contiguous set of memory cells, for example, a set of memory cells arranged consecutively on the same word line (cell $12_1$ is directly adjacent to cell $12_2$, cell $12_2$ is directly adjacent to cell $12_3$, and so forth). In some cases, consecutive cells on multiple word lines may be used together. For example, in a case where each available row in the reversed area includes 128 2T-2C ferroelectric memory cells and a 256-bit random number is generated, process 30 may be performed using two rows of memory cells.

In other embodiments, the set of 2T-2C ferroelectric memory cells used to generate the random number 40 may be non-contiguous. For example, as stated above, sense amplifiers used in conjunction with reading data from 2T-2C ferroelectric memory cells may exhibit some degree of offset that can be the result of transistor mismatch due to process variations. In some manufacturing processes, transistors that are closer together (e.g., adjacent transistors) may be subject to similar process variations. Sense amplifier offsets due to such process variations can, to some degree, influence the randomness of the reading step 34 in FIG. 3. Thus, in one embodiment, the set of ferroelectric memory cells used to generate random number 40 may be non-contiguous. For instance, the set of cells may be on the same word line, but may include non-consecutive cells. Referring to FIG. 6, consider a simplified example in which a 3-bit random number is generated using cells $12_{0,0}$, $12_{0,2}$, and $12_{0,3}$. In this case, cells $12_{0,0}$ and $12_{0,2}$ are on the same word line $WL_0$ but are not consecutively arranged.

In a further embodiment, the set of cells used to generate random number 40 may be distributed across different word lines, and can include consecutive or non-consecutive cells on the word lines. For instance, referring to FIG. 6 still, consider another simplified example in which a 4-bit random number is generated using cells $12_{3,0}$, $12_{1,1}$, $12_{1,2}$, and $12_{2,3}$. In this case, the cells used to generate the random number are spread across word lines $WL_3$, $WL_1$, and $WL_2$. Thus, depending on process variations that might exist with respect to the transistors in an FRAM array, using non-contiguous cells in the array can help to lessen any influence such process variations may have on randomness.

As will be understood, the various techniques described above and relating to the generation of random numbers using ferroelectric random access memory cells are provided herein by way of example only. Accordingly, it should be understood that the present disclosure should not be construed as being limited to only the examples provided above. Aspects of the techniques disclosed herein may be implemented in any suitable manner, including hardware (suitably configured circuitry), software (e.g., via a computer program including executable code stored on one or more tangible computer readable medium), or a combination of both hardware and software elements.

While the specific embodiments described above have been shown by way of example, it will be appreciated that many modifications and other embodiments will come to the mind of one skilled in the art having the benefit of the teachings presented in the foregoing description and the associated drawings. Accordingly, it is understood that various modifications and embodiments are intended to be included within the scope of the appended claims.

What is claimed is:

1. A method to generate a random number in memory device, the method comprising:
   in a memory array of the memory device in which the memory array includes a set of unit cells, with each unit cell including first and second sub-cells, using a first memory access mode to program a data pattern into the unit cells so that, as a result of programming the data pattern, the first and second sub-cells of any one unit cell of the unit cells store the same logic value; and
   after programming the data pattern into the unit cells, using a second memory access mode to read a respective bit value from each of the unit cells, wherein the respective bit value read from each of the unit cells has either a first logic value or a second logic value that is the complement of the first logic value, and wherein the bit values read from the unit cells collectively form bits of the random number.

2. The method of claim 1, wherein the first logic value is logic 1 and the data pattern is a uniform data pattern of the first logic value such that, after programming the data pattern into the unit cells, all first and second sub-cells store logic 1.

3. The method of claim 1, wherein the first logic value is logic 1 and the data pattern is a uniform data pattern of the second logic value, such that, after programming the data pattern into the unit cells, all first and second sub-cells store logic 0.

4. The method of claim 1, wherein each unit cell is coupled to a respective differential sense amplifier and, for each unit cell, using the second memory access mode to read the unit cell comprises:
   receiving, at a first input of the respective differential sense amplifier, a first signal from a first bit line coupled to the first sub-cell of the unit cell;
   receiving, at a second input of the respective differential sense amplifier, a second signal from a second bit line coupled to the second sub-cell of the unit cell; and
   producing, at an output of the respective differential sense amplifier, an output signal based on the first and second signals;
   wherein the output signal is the respective bit value read from the unit cell having either the first logic value or the second logic value.

5. The method of claim 4, wherein:
   the unit cells are ferroelectric random access memory (FRAM) cells;
   each FRAM cell includes first and second access transistors and first and second ferroelectric capacitors;

the first access transistor and the first ferroelectric capacitor form the first sub-cell; and the second access transistor and the second ferroelectric capacitor form the second sub-cell.

6. The method of claim 5, wherein:

the first memory access mode is a one-transistor-one-capacitor (1T-1C) mode; and the second memory access mode is a two-transistor-two-capacitor (2T-2C) mode.

7. The method of claim 4, wherein a probability of the respective bit value being the first logic value or the second logic value is due at least in part to the first and second signals not being complementary signals.

8. The method of claim 4, wherein a probability of the respective bit value being the first logic value or the second logic value is due at least in part to an offset of the respective differential sense amplifier.

9. The method of claim 1, wherein the data pattern is not uniform and, as a result of programming the data pattern, the first and second sub-cells of a first unit cell of the unit cells both store the first logic value and the first and second sub-cells of a second unit cell of the unit cells both store the second logic value.

10. The method of claim 1, further comprising, after using the second memory access mode to read from the unit cells the bit values that form the random number, using the second memory access mode to program the random number into the unit cells.

11. The method of claim 1, further comprising, after using the second memory access mode to read from the unit cells the bit values that form the random number, using the second memory access mode to program the random number into another set of unit cells of the memory array that are separate from the unit cells.

12. A memory device comprising:

a memory array that includes a set of n unit cells, wherein each unit cell includes first and second sub-cells; and a memory controller configured to:

use a first memory access mode to program a data pattern into the unit cells so that, as a result of programming the data pattern, the first and second sub-cells of any one unit cell of the unit cells store the same logic value; and after programming the data pattern into the unit cells, use a second memory access mode to read from the n unit cells n bit values, respectively, wherein each of the n bit values has either a first logic value or a second logic value that is the complement of the first logic value, wherein the n bit values form an n-bit random number.

13. The memory device of claim 12, wherein the first logic value is logic 1 and the data pattern is a uniform data pattern of the first logic value such that, after programming the data pattern into the unit cells, all first and second sub-cells store logic 1.

14. The memory device of claim 12, wherein the first logic value is logic 1 and the data pattern is a uniform data pattern of the second logic value, such that, after programming the data pattern into the unit cells, all first and second sub-cells store logic 0.

15. The memory device of claim 12, wherein the data pattern comprises 2n uniform bits.

16. The memory device of claim 12, further comprising n differential sense amplifiers each coupled to a respective one of the n unit cells, wherein, for each unit cell, using the second memory access mode to read the unit cell comprises:

receiving, at a first input of a respective differential sense amplifier, a first signal from a first bit line coupled to the first sub-cell of the unit cell;

receiving, at a second input of the respective differential sense amplifier, a second signal from a second bit line coupled to the second sub-cell of the unit cell; and producing, at an output of the respective differential sense amplifier, an output signal based on the first and second signals;

wherein the output signal is the respective bit value read from the unit cell having either the first logic value or the second logic value.

17. The memory device of claim 16, wherein:

each of the n unit cells are ferroelectric random access memory (FRAM) cells, each including first and second access transistors and first and second ferroelectric capacitors;

the first access transistor and the first ferroelectric capacitor form the first sub-cell;

the second access transistor and the second ferroelectric capacitor form the second sub-cell;

the first memory access mode is a one-transistor-one-capacitor (1T-1C) mode; and the second memory access mode is a two-transistor-two-capacitor (2T-2C) mode.

18. The memory device of claim 16, wherein a probability of the respective bit value being the first logic value or the second logic value is due at least in part to an offset of the respective differential sense amplifier.

19. The method of claim 12, wherein the data pattern is not uniform and, as a result of programming the data pattern into the unit cells, the first and second sub-cells of a first unit cell of the unit cells both store the first logic value and the first and second sub-cells of a second unit cell of the unit cells both store the second logic value.

* * * * *